(12) United States Patent
Wakabayashi

(10) Patent No.: US 7,371,286 B2
(45) Date of Patent: May 13, 2008

(54) WIRING REPAIR APPARATUS

(75) Inventor: Koji Wakabayashi, Kanagawa (JP)

(73) Assignee: Laserfront Technologies, Inc., Kanagawa (JP)

( * ) Notice: Subject to any disclaimer, the term of this patent is extended or adjusted under 35 U.S.C. 154(b) by 0 days.

(21) Appl. No.: 10/940,982

(22) Filed: Sep. 15, 2004

(65) Prior Publication Data
US 2005/0061780 A1     Mar. 24, 2005

(30) Foreign Application Priority Data
Sep. 24, 2003 (JP) ............................. 2003-332211

(51) Int. Cl.
*C23C 16/48*     (2006.01)
(52) U.S. Cl. .................................... 118/722
(58) Field of Classification Search ................. 118/722
See application file for complete search history.

(56) References Cited

U.S. PATENT DOCUMENTS

| | | | | |
|---|---|---|---|---|
| 4,778,693 A | * | 10/1988 | Drozdowicz et al. | 427/584 |
| 6,057,180 A | * | 5/2000 | Sun et al. | 438/132 |
| 6,090,458 A | * | 7/2000 | Murakami | 427/586 |
| 6,136,096 A | * | 10/2000 | Morishige | 118/720 |
| 6,656,539 B1 | * | 12/2003 | Haight et al. | 427/553 |
| 2002/0047095 A1 | | 4/2002 | Morishige, et al. | |
| 2002/0152809 A1 | * | 10/2002 | Shirai et al. | 73/299 |

FOREIGN PATENT DOCUMENTS

| | | | |
|---|---|---|---|
| JP | 10-280152 A | | 10/1998 |
| JP | H10-324973 A | | 12/1998 |
| JP | 2000-328247 | * | 11/2000 |
| JP | 2000-328247 A | | 11/2000 |
| JP | 2002-124380 | * | 4/2002 |
| KR | 2003-0058220 A | | 7/2003 |

OTHER PUBLICATIONS

Random House Webster's Unabridged Dictionary, Random House, 2001, p. 1421.*

* cited by examiner

*Primary Examiner*—Richard Bueker
(74) *Attorney, Agent, or Firm*—Sughrue Mion, PLLC

(57) ABSTRACT

A wiring repair apparatus includes an XY stage on which a substrate is placed, a laser source unit disposed above the XY stage, first and second gas windows disposed between the laser source unit and the XY stage, and first and second CVD gas units. The laser source unit emits a laser beam to a part of the substrate to be repaired. This laser beam passes through either the first or second gas window. The first CVD gas unit supplies an Al source gas (DMAH gas) to the first gas window while the second CVD gas unit supplies a Cr source gas ($Cr(CO)_6$ gas) to the second gas window.

4 Claims, 6 Drawing Sheets

WIRING REPAIR APPARATUS

BACKGROUND OF THE INVENTION

1. Field of the Invention

The present invention relates to wiring repair apparatuses for repairing defective parts of wiring formed on a substrate and, particularly, it relates to a wiring repair apparatus for repairing breaks in wiring by laser chemical vapor deposition (CVD).

2. Description of the Related Art

Liquid crystal displays (LCDS) have become rapidly widespread over the past several years. This trend is being driven by LCDs based on semiconductor thin-film transistor (TFT) technology. There are two types of TFTs: amorphous silicon (a-Si) TFTs and polysilicon (poly-Si) TFTs. These two types of TFTs have similar principles and structures. As LCDs have recently become larger, defects such as shorts and breaks occur more frequently in the wiring of integrated circuits, including TFTs and their peripheries.

FIG. 1 is an equivalent circuit diagram of an LCD. FIG. 2 is a partial sectional view of a TFT in the LCD. In FIG. 1, an LCD 101 includes a first glass substrate 102 (see FIG. 2), a second glass substrate (not shown in the drawings) opposed to the first glass substrate 102, and a liquid crystal layer (not shown in the drawings) disposed between the first glass substrate 102 and the second glass substrate. A common electrode C is formed on the surface of the second glass substrate facing the first glass substrate 102. Gate lines $G_1$ to $G_m$ (m is a natural number) and source lines $S_1$ to $S_n$ (n is a natural number) are provided on the surface of the first glass substrate 102 facing the second glass substrate. The gate lines G extend in parallel in a row direction while the source lines S extend in parallel in a column direction.

In plan view, (m×n) pixels 104 are arranged in a matrix. These pixels 104 correspond to the areas where the gate lines G and the source lines S intersect each other. Each pixel 104 includes a metal-oxide semiconductor field-effect transistor (MOSFET) 105 and a capacitor 106. The MOSFET 105 is a TFT. The source of the MOSFET 105 is connected to any source line S. The gate of the MOSFET 105 is connected to any gate line G. The drain of the MOSFET 105 is connected to one electrode of the capacitor 106. The drain of the MOSFET 105 and the common electrode C apply voltage to a liquid crystal cell 103. The other electrode of the capacitor 106 is connected to a capacitor electrode Cs. The liquid crystal cell 103 is the part of the liquid crystal layer corresponding to each pixel 104. In other words, the collection of the liquid crystal cells 103 constitutes the liquid crystal layer.

Referring to FIG. 2, a gate electrode 107 connected to any gate line G (see FIG. 1) is provided on the first glass substrate 102. A gate-insulating film 108 covering the gate electrode 107 is provided on the overall surface of the first glass substrate 102. A functional film 109 composed of amorphous silicon (a-Si) is formed on the gate-insulating film 108 above the gate electrode 107. This functional film 109 constitutes the channel region of the MOSFET 105 and includes a lower layer 109a composed of a-Si and an upper layer 109b composed of n-doped amorphous silicon ($n^+$ a-Si). One end of the functional film 109 is covered with a source electrode 110 connected to any source line S (see FIG. 1) while another end of the functional film 109 is covered with a drain electrode 111 connected to the capacitor 106 (see FIG. 1). A protective film 112 covers the functional film 109, the source electrode 110, and the drain electrode 111.

In the manufacturing process of the LCD in FIGS. 1 and 2, defects such as breaks may occur in the source lines S, the gate lines G, the gate electrodes 107, the source electrodes 110, the drain electrodes 111, and the like (hereinafter collectively referred to as wiring) because of defective conditions in deposition, exposure, etching, and cleaning or the intrusion of airborne foreign particles in the clean room. Such defects cannot be completely avoided with any current advanced technology.

Laser repair technique has been expected to improve the yield of LCDs. In particular, techniques for breaking a short or shorting wiring between the upper and lower layers have become widespread in TFT manufacturing processes. For example, Japanese Patent Publication Laid Open No. 2000-328247 and No. hei 10-324973, to the present assignee, have disclosed a novel method for repairing breaks by laser CVD. This laser CVD technique has been put on the market to gain international recognition.

According to this laser CVD technique, tungsten (W) or chromium (Cr) is deposited on a break in wiring to repair the break. This laser CVD technique enables non-contact, non-heating repair of a defective part in a short time with the part kept in a dry state. Currently, every TFT-LCD manufacturer depends on this laser CVD technique as a wiring repair technique.

The above conventional technique, however, has the following problem. When a break in wiring is repaired by laser CVD, the material for deposition on the break is most preferably the same as that constituting the wiring. For example, an aluminum (Al) film is preferably deposited on a break in Al wiring by laser CVD, and a chromium (Cr) film is preferably deposited on a break in Cr wiring by laser CVD. Such repair provides wiring with uniform electrical conductivity. And, it provides wiring with uniform thermal expansivity, and therefore it makes heat load resistance of the wiring improve.

Most TFT-LCDs have wiring including two or more different materials. Table 1 shows materials for individual components of TFT-LCDs. This table 1 is sourced from "Liquid crystal device handbook," issued by Nikkan Kogyo Shimbun, Ltd. According to Table 1, typical materials for wiring and electrodes in TFT-LCDs include metals such as Al, molybdenum (Mo), and Cr. Currently, most TFT-LCDs have wiring including different materials; an example is wiring including Al gate lines and Cr source lines.

TABLE 1

| Component | | Material |
|---|---|---|
| TFT | Functional film | a-Si, $n^+$ a-Si, poly-Si |
| | Insulating film | $Si_3N_4$ |
| | Protective film | $SiN_x$ |
| | Electrode film | Al, Mo, Cr |
| MIM | Metal film | Ta, Cr |
| | Insulating Film | $Ta_xO_y$ |
| Pixel electrode | | $ITO(In_2O_3 + Sn)$, $IO(In_2O_3)$ |
| Alignment film | | polyimide, $SiO_x$ |

As described above, however, normal laser CVD apparatuses can deposit only one material (for example, either W or Cr). If, for example, TFT-LCD wiring including Al gate lines and Cr source lines is repaired with a laser CVD apparatus capable of Cr deposition, the Cr source lines can be successfully repaired but the Al gate lines undesirably include parts repaired with Cr. Such repaired parts, having non-uniform electrical conductivity and non-uniform thermal expansivity, cause thermal stress when a heat load is applied. The repaired wiring therefore has the disadvantage of reliability.

An approach to the problem described above is the use of the same number of laser CVD apparatuses as the materials used for wiring. In the above example, according to this approach, the gate lines are repaired with a first laser CVD apparatus capable of Al deposition while the source lines are repaired with a second laser CVD apparatus capable of Cr deposition. This approach, however, requires a plurality of laser CVD apparatuses, thus having the problems that the equipment cost increases and the repair efficiency decreases.

Another approach is the replacement of a feedstock for CVD with another feedstock in a single laser CVD apparatus. In the above example, according to this approach, dimethylaluminum hydride (DMAH) is supplied to a laser CVD apparatus as a feedstock for Al deposition to repair the gate lines, and chromium hexacarbonyl ($Cr(CO)_6$) is then supplied to the laser CVD apparatus as a feedstock for Cr deposition to repair the source lines.

This approach, however, encounters the problem that a single laser CVD apparatus has difficulty in processing different feedstocks because they require different processes for generating a source gas for CVD. In the above example, DMAH, which is a feedstock for Al, is normally a liquid and is therefore vaporized to generate a source gas for CVD. On the other hand, $Cr(CO)_6$, which is a feedstock for Cr, is normally a solid and is therefore sublimated to generate a source gas for CVD. Thus, a single laser CVD apparatus has difficulty in processing both DMAH and $Cr(CO)_6$ because they require different processes for generating a source gas.

SUMMARY OF THE INVENTION

An object of the present invention is to provide a wiring repair apparatus for efficiently repairing wiring including different materials without decreasing its quality and reliability.

The present invention provides a wiring repair apparatus for repairing a defective part of wiring formed on a substrate by laser CVD. This wiring repair apparatus includes a laser source unit for irradiating the defective part of the wiring with a laser beam; CVD gas units for producing different source gases for CVD; and a gas window unit that is supplied with the source gases from the CVD gas units and supplies the source gases to the irradiated part of the wiring.

According to the present invention, this wiring repair apparatus, having the CVD gas units for producing the different source gases for CVD, can deposit a plural kind of film formed of different materials on the substrate. If, therefore, wiring including different materials has defective parts composed of different materials, this wiring can be repaired by depositing the same materials as the defective parts on the defective parts. The repaired wiring therefore has higher quality and reliability. In this specification, the term "wiring" refers to conductive members; for example, this term also includes source electrodes, drain electrodes, and gate electrodes.

Preferably, the gas window unit has the number of gas windows as the CVD gas unit, and the different source gases produced by the CVD gas units are supplied to the different gas windows. Such an apparatus does not require the purge of the gas windows for each replacement of the source gas used because each gas window is supplied with only one source gas. This apparatus therefore has higher repair efficiency.

One of the source gases may be dimethylaluminum hydride (DMAH) gas for depositing Al on a defective part by laser CVD.

In addition, one of the source gases may be chromium hexacarbonyl ($Cr(CO)_6$) gas for depositing Cr on a defective part by laser CVD.

According to the present invention, this wiring repair apparatus, which has the CVD gas units and supplies the different source gases, allows efficient repair of wiring including different materials without decreasing its quality and reliability.

DETAILED DESCRIPTION OF THE PREFERRED EMBODIMENT

Figure 3:
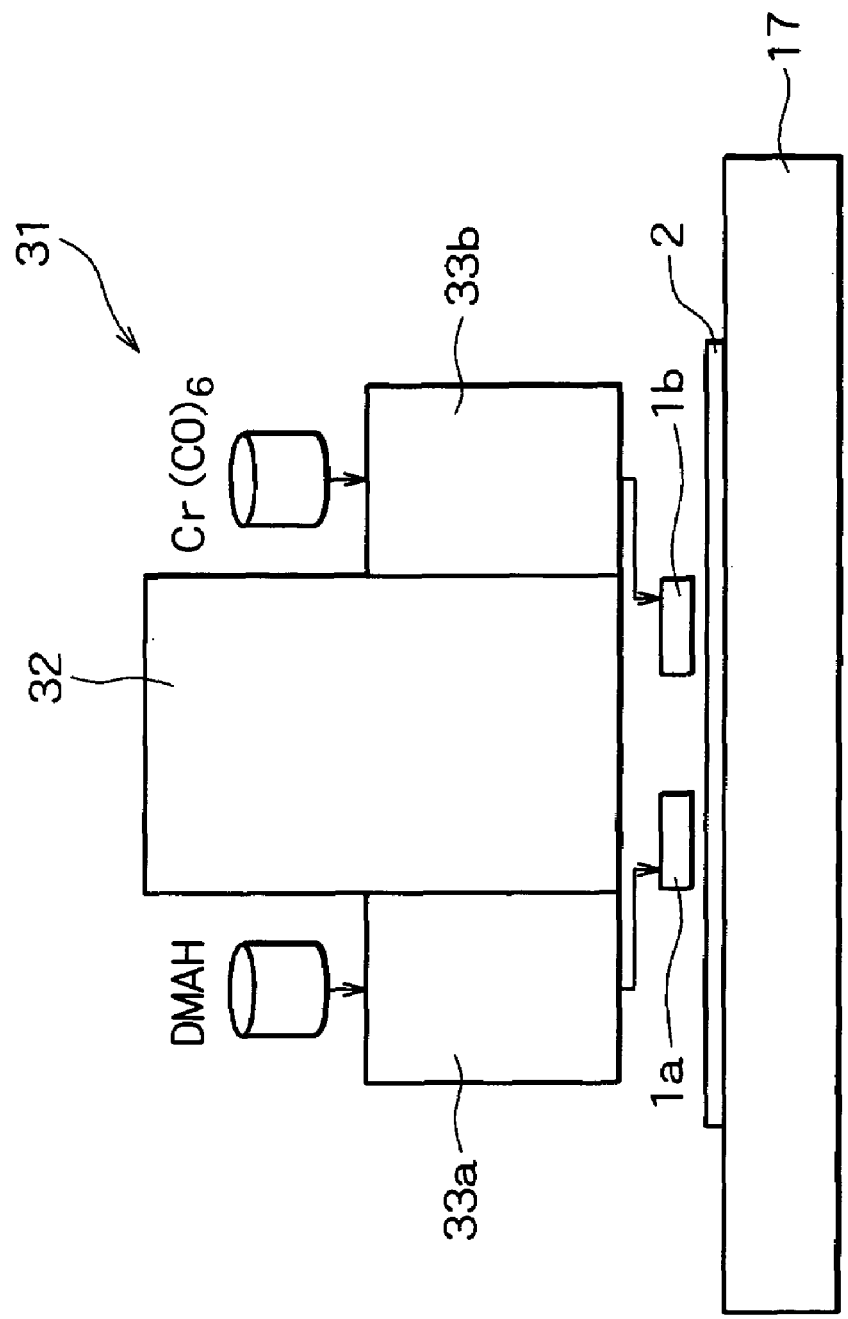
FIG. 3 is a schematic diagram of a wiring repair apparatus according to an embodiment of the present invention.
Figure 4:
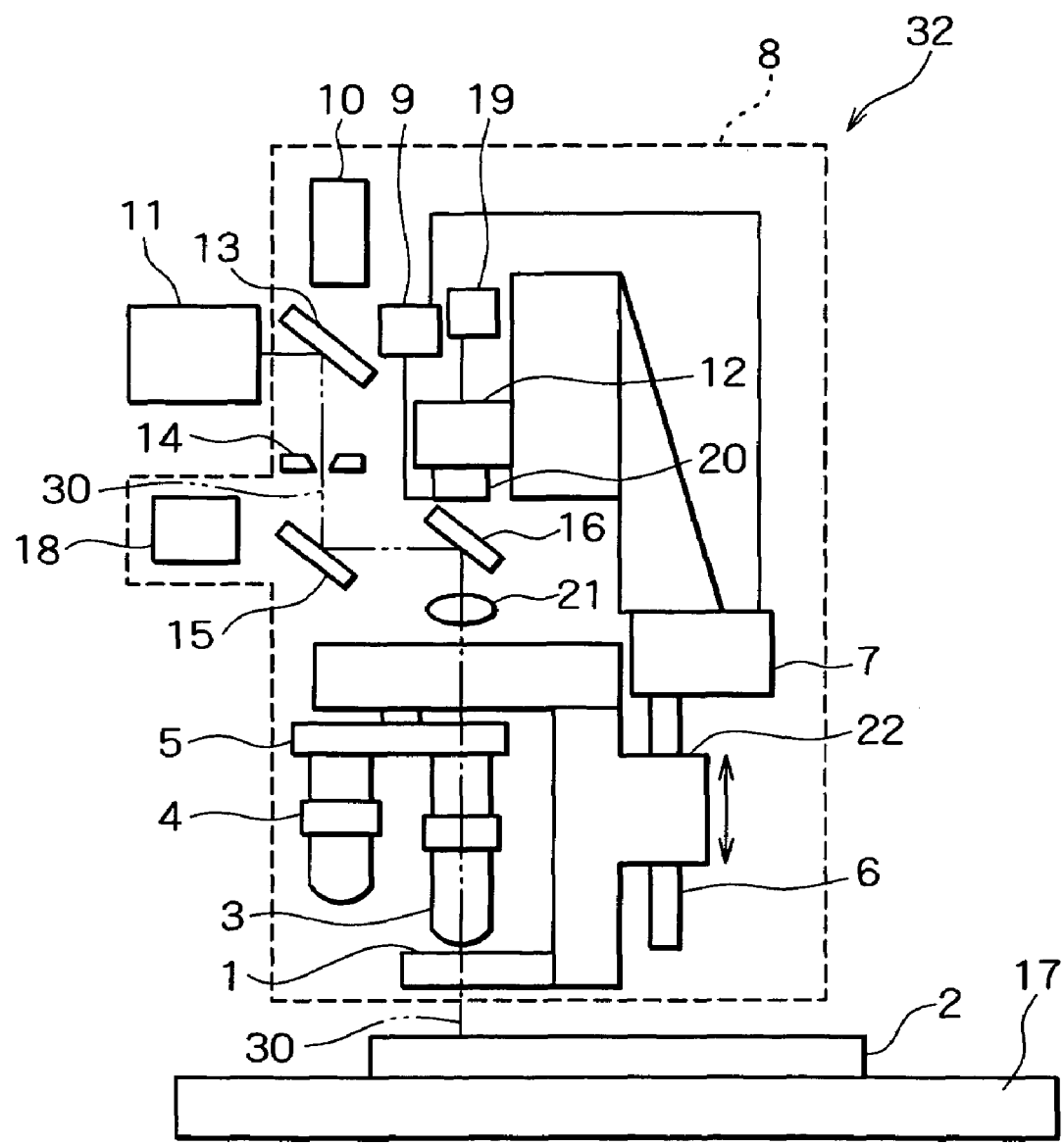
FIG. 4 is a schematic diagram of a laser source unit and its periphery in the wiring repair apparatus shown in FIG. 3.
Figure 5:
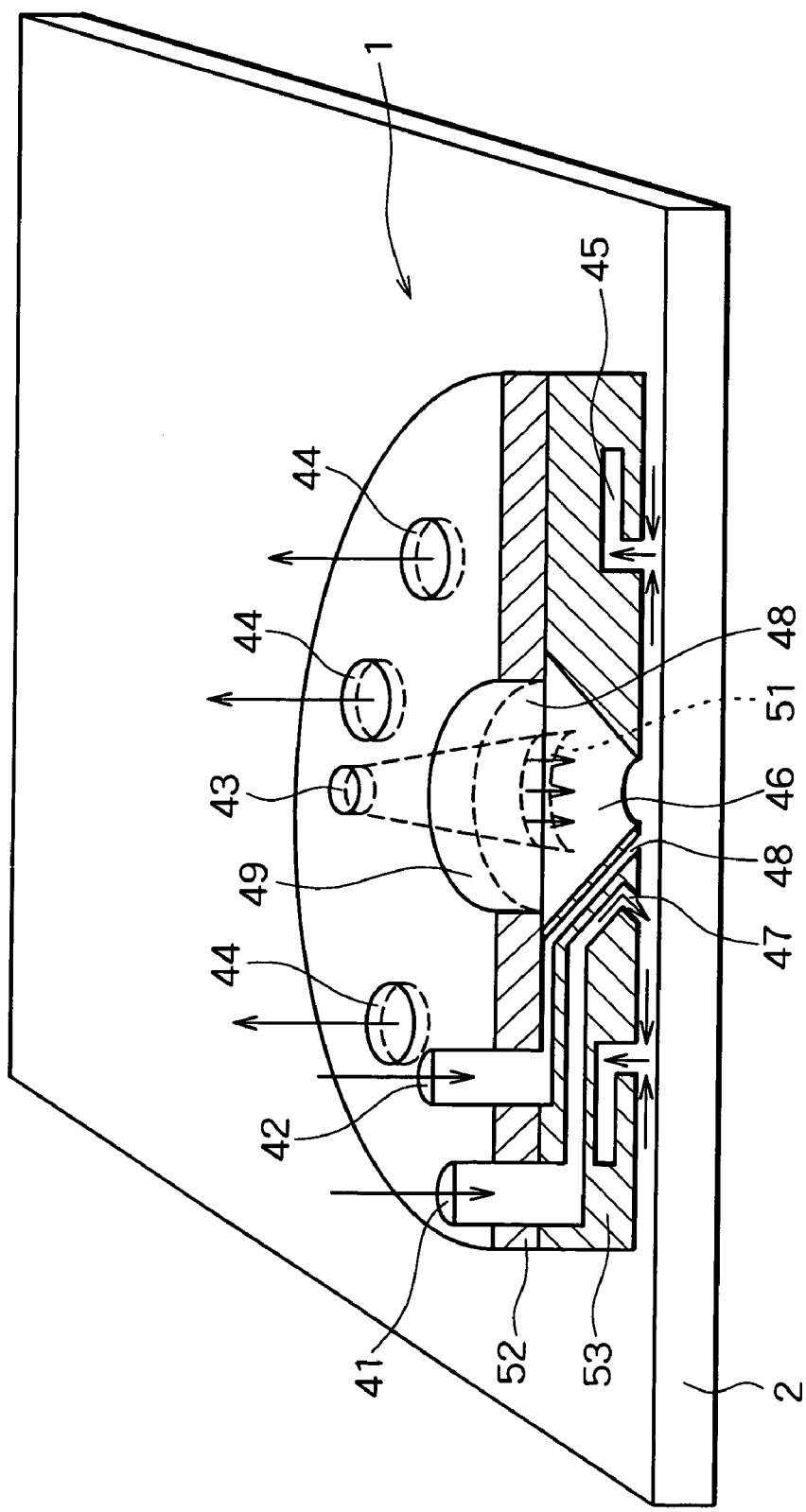
FIG. 5 is a sectional perspective view of a gas window shown in FIG. 3.

An embodiment of the present invention will now be specifically described with reference to the accompanying drawings. FIG. 3 is a schematic diagram of a wiring repair apparatus according to an embodiment of the present invention. FIG. 4 is a schematic diagram of a laser source unit and its periphery in the wiring repair apparatus shown in FIG. 3. FIG. 5 is a sectional perspective view of a gas window shown in FIG. 3. The wiring repair apparatus according to this embodiment is a laser CVD apparatus.

Figure 1:
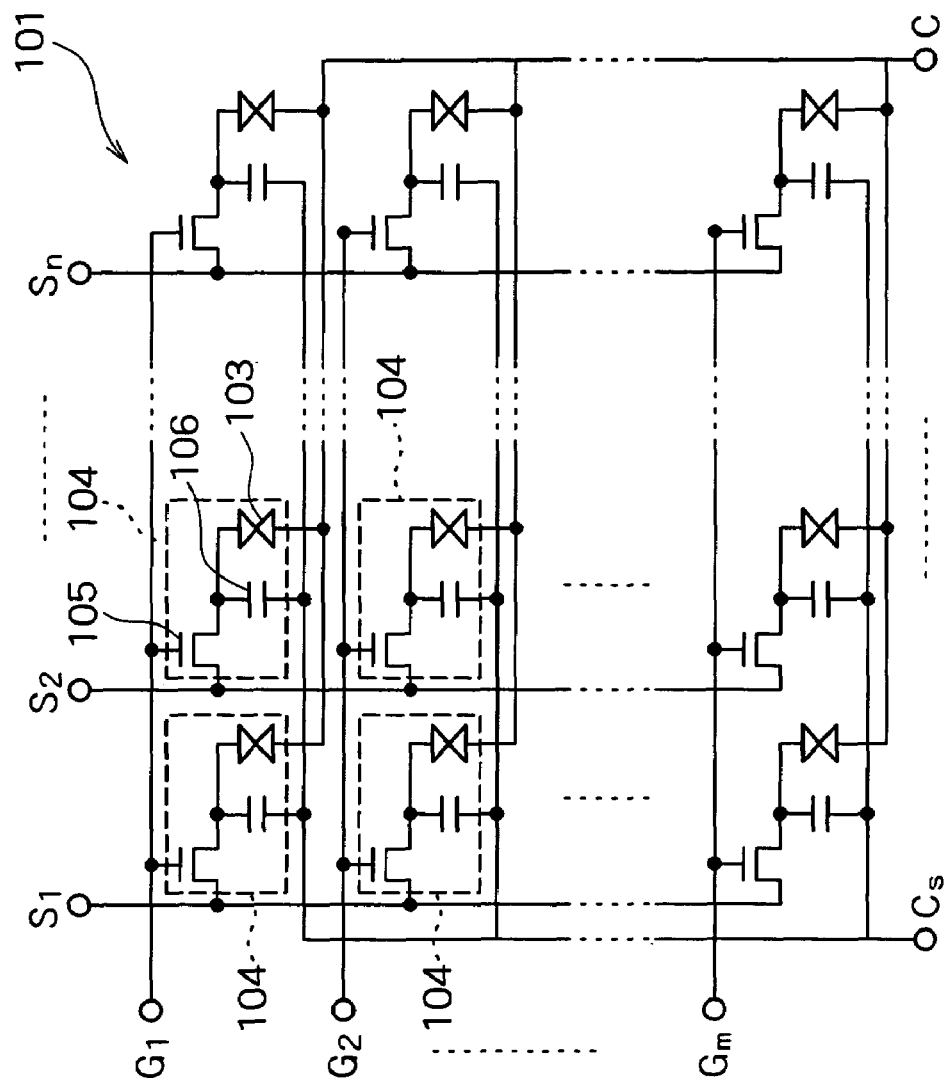
FIG. 1 is an equivalent circuit diagram of an LCD.
Figure 2:
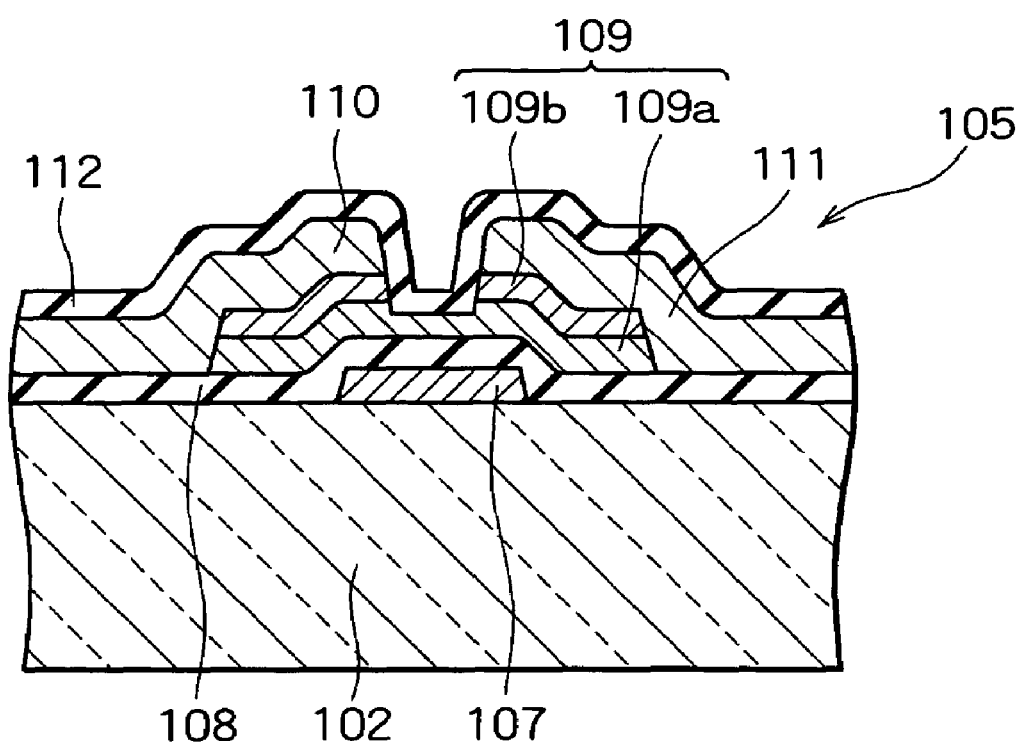
FIG. 2 is a partial sectional view of a TFT in the LCD.

As shown in FIG. 3, a wiring repair apparatus 31 according to this embodiment includes an XY stage 17 onto which a substrate 2 to be repaired is placed. This substrate 2 is, for example, a glass substrate of an LCD as shown in FIGS. 1 and 2, and has TFTs, Al gate lines, and Cr source lines on its surface. The XY stage 17 freely moves the substrate 2 in horizontal directions, namely the X and Y directions.

A laser source unit 32 is provided above the XY stage 17 with two gas windows 1a and 1b (hereinafter also collectively referred to as gas windows 1) disposed therebetween. The gas windows 1a and 1b compose a gas window unit. The laser source unit 32 emits a laser beam to a part of the substrate 2 to be repaired through either gas window 1a or 1b. The movement of the XY stage 17 allows the laser beam to impinge on any position of the substrate 2.

The wiring repair apparatus 31 further includes a CVD gas unit 33a for supplying a CVD source gas to the gas window 1a and a CVD gas unit 33b for supplying a CVD source gas to the gas window 1b. For example, the CVD gas unit 33a vaporizes supplied DMAH to supply an Al source gas (DMAH gas) to the gas window 1a while the CVD gas unit 33b sublimates supplied $Cr(CO)_6$ to supply a Cr source gas ($Cr(CO)_6$ gas) to the gas window 1b. In addition to the above source gases, the CVD gas units 33a and 33b supply the gas windows 1a and 1b, respectively, with a canceling gas (for example, argon (Ar) gas) for preventing air from being drawn into the space between the gas windows 1a and 1b and the substrate 2 and a window purge gas (for example, Ar gas) for preventing a window member of the gas windows 1a and 1b from fogging.

In the deposition of an Al film, the gas window 1a is positioned above a part of the substrate 2 to be repaired at a predetermined distance from the substrate 2. The gas window 1a is supplied with the source gas from the CVD gas unit 33a while being irradiated with a laser beam from the laser source unit 32. The gas window 1a allows the laser beam to impinge on the part of the substrate 2 to be repaired while supplying the source gas to the irradiated part. As a result, an Al film is formed on the part of the substrate 2 to be repaired. In the deposition of a Cr film, similarly, the gas window 1b is positioned above a part of the substrate 2 to be repaired at a predetermined distance from the substrate 2. The gas window 1b is supplied with the source gas from the CVD gas unit 33b while being irradiated with a laser beam from the laser source unit 32. As a result, a Cr film is formed on the part of the substrate 2 to be repaired.

Referring to FIG. 4, the laser source unit 32 includes a microscopic laser optical unit 8 and a laser source 11 above the substrate 2. A laser beam 30 emitted from the laser source 11 passes through the microscopic laser optical unit 8 and either gas window 1 to impinge on the substrate 2. The laser beam 30 emitted from the laser source 11 is, for example, the third harmonic of an Nd:YAG laser at a wavelength of 355 nm.

A first half mirror 13, a second half mirror 15, and a third half mirror 16 are disposed in the microscopic laser optical unit 8 such that the laser beam 30 emitted from the laser source 11 is reflected by the first half mirror 13, the second half mirror 15, and the third half mirror 16, in that order, to form its optical path.

A slit lighting unit 10 is disposed behind the first half mirror 13. Light emitted from the slit lighting unit 10 passes through the first half mirror 13 to combine with the laser beam 30 reflected by the first half mirror 13. The laser beam 30 then passes through a slit 14 disposed between the first half mirror 13 and the second half mirror 15. This slit 14 trims the cross-sectional shape of the laser beam 30 into the shape of a part of the wiring to be repaired. A lighting unit 18 is disposed behind the second half mirror 15. Light emitted from the lighting unit 18 passes through the second half mirror 15 to combine with the laser beam 30 reflected by the second half mirror 15.

The laser beam 30 reflected by the third half mirror 16 then passes through a relay lens 21 and a revolver 5, in that order. The revolver 5 has a high-powered first objective lens 3 and a low-powered second objective lens 4. The revolution of the revolver 5 allows the laser beam 30 to pass through either the first objective lens 3 or the second objective lens 4. The laser beam 30 passing through either objective lens 3 or 4 enters either gas window 1.

The revolver 5 and the gas windows 1 are supported by a supporter 22 having a screw hole (not shown in the drawings) into which a screw 6 is screwed. This screw 6 is connected to a drive shaft of a motor 7. Driving the motor 7 revolves the screw 6 to change the height of the supporter 22, the gas windows 1, the revolver 5, the first objective lens 3, and the second objective lens 4.

The light reflected by the substrate 2 enters an AF optical unit 20 and a camera 12 disposed on the other side of the third half mirror 16 from the relay lens 21. The AF optical unit 20 then outputs a signal to an AF controller 9 which detects the focal point of the light impinging on the substrate 2 to output a control signal to the motor 7 according to the detection result. The AF optical unit 20 and the AF controller 9 employ a laser autofocus detection system, which can detect a focal point even if the substrate 2 has no pattern on its surface. The camera 12 is connected to a TV monitor 19 that displays a pattern on the substrate 2.

The structure of each gas window 1 will now be described. Referring to FIG. 5, the gas window 1 includes two bonded discs 52 and 53. The upper disc 52 is adjacent to the laser source unit 32 (see FIG. 3) while the lower disc 53 is adjacent to the substrate 2. A circular window member 49 composed of a transparent material such as glass is provided in the center of the upper disc 52. A conical opening 46 diverging upward is formed in the lower disc 53 below the window member 49. The laser beam 30 (see FIG. 4) emitted from the laser source unit 32 passes through the window member 49 and the opening 46 to impinge on a part of the substrate 2 to be repaired.

A canceling gas inlet 41 and a source gas inlet 42 are formed in the periphery of the window member 49 of the upper disc 52. The canceling gas inlet 41 communicates with a nozzle 47 formed at the bottom surface of the lower disc 53 through a gas channel formed in the lower disc 53 while the source gas inlet 42 communicates with a nozzle 48 formed at the bottom surface of the lower disc 53 through another gas channel formed in the lower disc 53. The CVD gas unit 33a or 33b supplies a canceling gas to the canceling gas inlet 41 and a source gas to the source gas inlet 42. The nozzle 48 is inclined so as to inject the source gas toward the area directly under the opening 46. The nozzle 47 is formed such that the nozzle 48 is positioned between the nozzle 47 and the opening 46. This nozzle 47 is inclined so as to inject the canceling gas in the opposite direction to the injection direction of the source gas, namely in the direction away from the area directly under the opening 46.

In addition, a window purge gas inlet 43 is formed in the periphery of the window member 49 of the upper disc 52. This window purge gas inlet 43 communicates with a window purge gas outlet 51 formed in the side surface of the opening 46 of the lower disc 53. The CVD gas unit 33a or 33b supplies a window purge gas to the window purge gas inlet 43. The window purge gas is communicated through the window purge gas inlet 43 and the window purge gas outlet 51 to be injected toward the window member 49. Circular suction inlets 45 are formed in the bottom surface of the lower disc 53 so as to surround the opening 46 and the nozzles 47 and 48 while suction outlets 44 are formed in the upper disc 52 so as to surround the window member 49. The suction inlets 45 communicate with the suction outlets 44 so that the reacted source gas, canceling gas, and window purge gas drawn from the center of the gas window 1 and air drawn from the periphery of the gas window 1 are discharged through the suction outlets 44 to the outside of the gas window 1.

Figure 6:
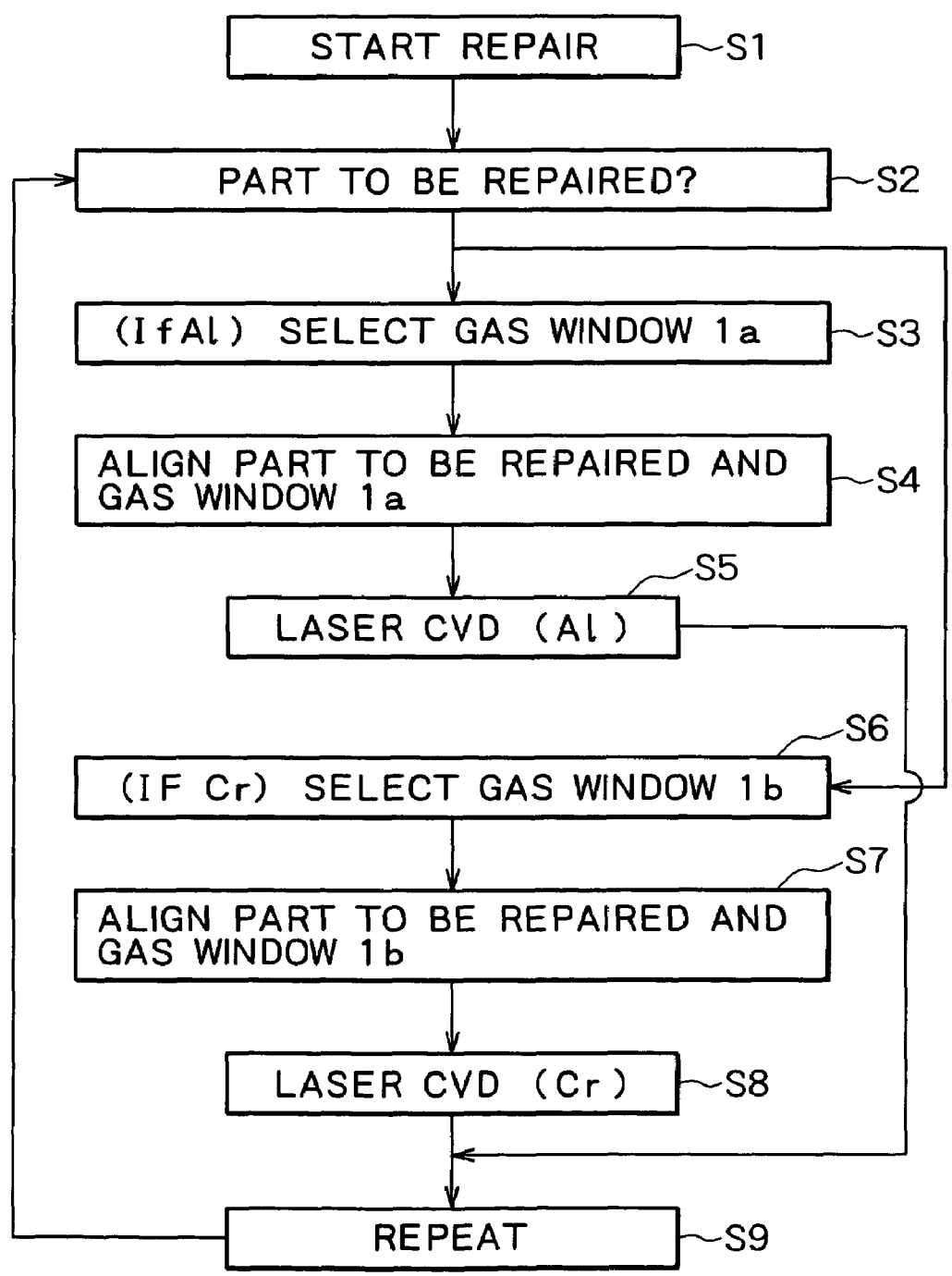
FIG. 6 is a flow chart of the operation of the wiring repair apparatus according to this embodiment.

The operation of the above wiring repair apparatus according to this embodiment will now be described with reference to FIGS. 3 to 6 on the assumption that Al gate lines and Cr source lines having breaks are formed on the substrate 2 to be repaired. FIG. 6 is a flow chart of the operation of the wiring repair apparatus according to this embodiment.

First, liquid DMAH is supplied to the CVD gas unit 33a of the wiring repair apparatus 31 while solid $Cr(CO)_6$ is supplied to the CVD gas unit 33b. The CVD gas unit 33a vaporizes the DMAH to produce an Al source gas (DMAH gas) while the CVD gas unit 33b sublimates the $Cr(CO)_6$ to produce a Cr source gas ($Cr(CO)_6$ gas). The CVD gas units 33a and 33b are also supplied with an Ar gas for use as a canceling gas and a window purge gas.

In Step S1 in FIG. 6, the repair process is started. The second objective lens 4, which is low-powered, is moved into the optical path of the laser beam 30. The motor 7 is then driven according to directions from the AF controller 9 to move the supporter 22 to the highest point in its range of movement. After the substrate 2 to be repaired is placed on the XY stage 17, the motor 7 is driven to lower the supporter 22 into the autofocus range of the AF optical unit 20.

The lighting unit 18 emits light which passes through the second half mirror 15, is reflected by the third half mirror 16, and passes through the relay lens 21, the second objective lens 4, and the window member 49 and opening 46 of either gas window 1 to illuminate the substrate 2. This light is reflected by the substrate 2 and passes through the gas window 1, the second objective lens 4, the relay lens 21, and the third half mirror 16 to enter the AF optical unit 20 and the camera 12. The AF optical unit 20 then outputs a focus error signal to the AF controller 9. According to the signal, the AF controller 9 drives the motor 7 to adjust the height of the supporter 22 using its autofocus function such that the focal point of the laser beam 30 is positioned at the substrate 2. The space between the substrate 2 and the gas window 1 is then, for example, 1 mm. The TV monitor 19 displays an image of the substrate 2 taken with the camera 12.

In Step S2 in FIG. 6, a defective part to be repaired is selected. If the defective part is included in the Al gate lines, the repair process continues to Step S3 to allow the laser beam 30 to pass through the gas window 1*a*. If, on the other hand, the defective part is included in the Cr source lines, the repair process continues to Step S6 to allow the laser beam 30 to pass through the gas window 1*b*.

The repair process, if continuing to Step S3, then continues to Step S4 to adjust the position of the substrate 2 by moving the XY stage 17 so that the laser beam 30 impinges on the defective part. The opening 46 of the gas window 1*a* and the defective part of the substrate 2 are aligned by roughly adjusting the position of the substrate 2 with the second objective lens 4, revolving the revolver 5 to move the first objective lens 3, which is high-powered, into the optical path of the laser beam 30, and precisely adjusting the position of the substrate 2 with the first objective lens 3. The slit lighting unit 10 is then lit to adjust the size and shape of the slit 14 to those of the part of the wiring to be repaired.

In Step S5 in FIG. 6, an Al film is deposited on the defective part by laser CVD. First, the CVD gas unit 33*a* supplies the Al source gas (DMAH gas) to the source gas inlet 42 of the gas window 1*a*, the canceling gas (Ar gas) to the canceling gas inlet 41, and the window purge gas (Ar gas) to the window purge gas inlet 43. The source gas is injected through the nozzle 48 toward the part of the substrate 2 to be repaired. The canceling gas is injected through the nozzle 47 in the direction away from the part to be repaired. Thus, the canceling gas is injected in the opposite direction to the injection direction of the source gas, thereby preventing outside air from being drawn by the injection of the source gas. In addition, the window purge gas is injected from the window purge gas outlet 51 toward the window member 49 to prevent the source gas from adhering to and therefore fogging the window member 49.

The laser source 11 emits the laser beam 30, which is reflected by the first half mirror 13 to pass through the slit 14. The slit 14 then trims the cross-sectional shape of the laser beam 30 into the shape of the part to be repaired. Subsequently, the laser beam 30 is reflected by the second half mirror 15 and the third half mirror 16, passes through the relay lens 21 and the first objective lens 3, and enters the window member 49 of the gas window 1*a*. The laser beam 30 then passes through the window member 49 and the opening 46 to impinge on the part of the substrate 2 to be repaired.

The part of the substrate 2 to be repaired, namely a break in the Al gate lines, is supplied with the source gas while being irradiated with the laser beam 30, thereby depositing Al to form an Al film on the break in the gate lines. This Al film connects the break, with the result that the defective part is repaired. The repair process continues to Step S9 and returns to Step S2.

If, on the other hand, the defective part is included in the Cr source lines, the repair process continues from Step S2 to Step S6 and then Step S7. In Step S7, the opening 46 of the gas window 1*b* and the part of the substrate 2 to be repaired are aligned in the same manner as in Step S4.

The repair process then continues to Step S8. In this step, the defective part of the source lines is repaired by depositing a Cr film on the defective part with the CVD gas unit 33*b* and the gas window 1*b* in the same manner as in Step S5. The CVD gas unit 33*b* supplies $Cr(CO)_6$ gas as a source gas to the gas window 1*b*. Subsequently, the repair process continues to Step S9 and returns to Step S2. The above steps from Step S2 to Step S9 are repeated until all parts of the substrate 2 to be repaired are repaired. As a result, the repair of the breaks on the substrate 2 is completed.

As described above, the wiring repair apparatus according to this embodiment is provided with two CVD gas units for supplying DMAH gas and $Cr(CO)_6$ gas to parts to be repaired as source gases for CVD. Using this apparatus, breaks in gate lines composed of Al can be repaired by forming Al films on these breaks while breaks in source lines composed of Cr can be repaired by forming Cr films on these breaks. Thus, wiring including different materials can be repaired by covering breaks with the same materials as the broken parts. The repaired wiring can therefore achieve uniform physical properties including electrical characteristics. This wiring can also achieve uniform thermal expansivity, so that no thermal stress occurs when a heat load is applied. This wiring therefore has higher heat load resistance and less deterioration with time to provide higher quality and reliability.

In addition, this wiring repair apparatus, having the two CVD gas units, can supply the two source gases with different characteristics, namely DMAH gas and $Cr(CO)_6$ gas, at the same time. This apparatus therefore has significantly higher repair efficiency than that having only one CVD gas unit and therefore requiring the replacement of the source gas used with another source gas.

Furthermore, the wiring repair apparatus according to this embodiment has two gas windows dedicated to the individual source gases. If a single gas window is shared by different source gases, the interior of the gas window must be completely purged for the replacement of the source gas used with another source gas to provide a uniform source gas concentration. The purge takes a long time, for example 4 to 5 hours, thus significantly decreasing the repair efficiency. The wiring repair apparatus according to this embodiment, on the other hand, has the same number of gas windows as the CVD gas units. This apparatus therefore does not require the purge for the replacement of the source gas used and does not decrease the repair efficiency.

The wiring repair apparatus according to this embodiment has the two CVD gas units and the two gas windows and supplies the two source gases, namely DMAH gas and $Cr(CO)_6$ gas; however, the present invention is not limited to this embodiment. For example, other source gases may be used. In addition, more than two source gases may be used along with more than two CVD gas units and gas windows. Though the above embodiment is applied to the repair of gate and source lines in LCDs, the present invention may be applied to the repair of other integrated circuits.

What is claimed is:

1. A wiring repair apparatus for repairing a defective part of wiring formed on a substrate by laser CVD, the apparatus comprising:
    a laser source unit for irradiating the defective part of said wiring with a laser beam;
    CVD gas units for producing different source gases for CVD, where a first of said gas units is supplied with liquid feedstock and the first gas unit supplied with the feedstock vaporizes the feedstock to produce a source gas, and a second of said gas units is supplied with solid feedstock and the second of said gas units subliminates the feedstock to produce a different source gas;
    a gas window unit comprising a plurality of gas windows including a first gas window and a second gas window supplied with said source gases from said CVD gas units to supply said source gases to the irradiated part of said wiring; and
    a plurality of CVD gas paths including a first gas path which connects the first gas unit with the first gas window to channel the source gas and a second gas path which connects the second gas unit with the second gas window to channel the different source gas,
    wherein said gas window unit comprises the same number of gas windows as said CVD gas units, and the different source gases produced by said CVD gas units are supplied to said plurality of gas windows,
    wherein the first gas path connects the first gas unit to the first gas window and the second gas path connects the second gas unit to the second gas window, at the same time.

2. The wiring repair apparatus according to claim 1, wherein one of said source gases is dimethylaluminum hydride gas.

3. The wiring repair apparatus according to claim 1, wherein one of said source gases is chromium hexacarbonyl gas.

4. The wiring repair apparatus according to claim 1, wherein said laser beam is the third harmonic of an Nd:YAG laser at a wavelength of 355 nm.

* * * * *